US012765065B2

(12) United States Patent
Wu et al.

(10) Patent No.: US 12,765,065 B2
(45) Date of Patent: Oct. 13, 2026

(54) ELECTRONIC DEVICE

(71) Applicant: InnoLux Corporation, Miao-Li County (TW)

(72) Inventors: Cheng-Min Wu, Miao-Li County (TW); Ming-Jhih Chen, Miao-Li County (TW); Wei-Chen Liu, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 390 days.

(21) Appl. No.: 18/628,783

(22) Filed: Apr. 7, 2024

(65) Prior Publication Data

US 2024/0371891 A1 Nov. 7, 2024

(30) Foreign Application Priority Data

May 4, 2023 (CN) ......................... 202310490408.0

(51) Int. Cl.
*H10D 86/60* (2025.01)
*H10D 86/40* (2025.01)

(52) U.S. Cl.
CPC ........... *H10D 86/60* (2025.01); *H10D 86/443* (2025.01)

(58) Field of Classification Search
None
See application file for complete search history.

(56) References Cited

U.S. PATENT DOCUMENTS

2004/0125278 A1* 7/2004 Park .................. G02F 1/133514 349/106
2016/0043104 A1* 2/2016 Li ..................... G02F 1/134363 257/773
2016/0377913 A1* 12/2016 Yeh .................. G02F 1/133512 349/106
2019/0286267 A1* 9/2019 Lin ................... G02F 1/136286

FOREIGN PATENT DOCUMENTS

CN 105278145 B 7/2018
CN 112785917 B 10/2023
TW 201602648 A 1/2016

* cited by examiner

*Primary Examiner* — Bilkis Jahan
(74) *Attorney, Agent, or Firm* — Winston Hsu

(57) ABSTRACT

An electronic device includes a substrate, two data lines, two scan lines, an opening region and a light shielding pattern. The two data lines are adjacently disposed on the substrate. The two scan lines are adjacently disposed on the substrate and extend along a first direction. The two data lines and the two scan lines define a pixel. The opening region is disposed corresponding to the pixel and has a first edge and a second edge disposed opposite to each other and extending along the first direction. There is a spaced distance between the first edge and the second edge in a second direction perpendicular to the first direction. The light shielding pattern is disposed adjacent to the opening region and includes a first portion located between a first extending line of the first edge and a second extending line of the second edge.

20 Claims, 12 Drawing Sheets

ELECTRONIC DEVICE

BACKGROUND OF THE DISCLOSURE

1. Field of the Disclosure

The present disclosure relates to an electronic device, and more particularly, to an electronic device with high resolution.

2. Description of the Prior Art

With the advancement of technology, electronic devices equipped with displays have become indispensable in modern life. However, the electronic devices have not yet met expectations in all aspects. With the enhancement of resolution and the reduction of pixel area, how to improve the resolution and the process yield of the electronic devices is still one of the goals of the industry. For example, in order to solve the problem of color shift at large viewing angle, it is necessary to add metal layers to block light or increase the width of the black matrix on the pixels. However, the opening rate is reduced thereby, which affects the transmittance.

SUMMARY OF THE DISCLOSURE

According to an embodiment of the present disclosure, an electronic device includes a substrate, two data lines, two scan lines, an opening region and a light shielding pattern. The two data lines are adjacently disposed on the substrate. The two scan lines are adjacently disposed on the substrate. The two data lines and the two scan lines define a pixel. Each of the two scan lines extends along a first direction. The opening region is disposed corresponding to the pixel. The opening region has a first edge and a second edge. The first edge and the second edge are disposed opposite to each other and extend along the first direction. There is a spaced distance between the first edge and the second edge in a second direction perpendicular to the first direction. The light shielding pattern is disposed adjacent to the opening region. The light shielding pattern includes a first portion located between a first extending line of the first edge and a second extending line of the second edge. A ratio of a width of the first portion in the second direction to the spaced distance is from 0.3 to 0.7.

According to another embodiment of the present disclosure, an electronic device includes a substrate, a plurality of data lines, a plurality of scan lines, a plurality of opening regions and two light shielding patterns. The plurality of data lines are disposed on the substrate. The plurality of scan lines are disposed on the substrate. The plurality of data lines and the plurality of scan lines define a plurality of pixels. Each of the plurality of scan lines extends along a first direction. The plurality of opening regions are disposed corresponding to the plurality of pixels respectively. The two light shielding patterns are disposed adjacent to each other. In the first direction, at least two opening regions of the plurality of opening regions are located between the two light shielding patterns.

These and other objectives of the present disclosure will no doubt become obvious to those of ordinary skill in the art after reading the following detailed description of the embodiment that is illustrated in the various figures and drawings.

DETAILED DESCRIPTION

Figure 1:
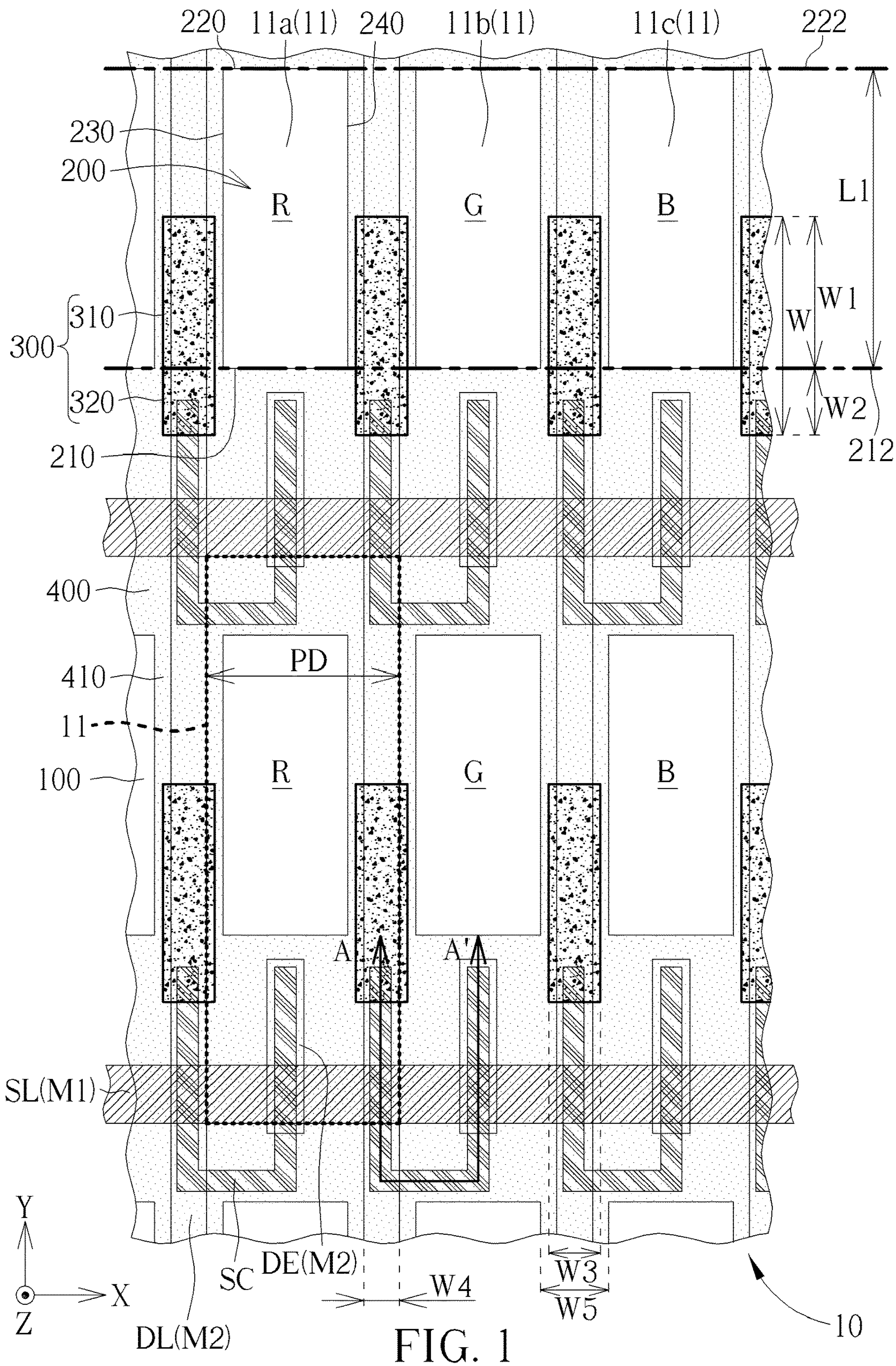
FIG. 1 is a schematic diagram showing a partial top view of an electronic device according to an embodiment of the present disclosure.

The present disclosure may be understood by reference to the following detailed description, taken in conjunction with the drawings as described below. Wherever possible, the same or similar parts in the drawings and descriptions are represented by the same reference numeral.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include/comprise" and "have" are used in an open-ended fashion, and thus should be interpreted to mean "include, but not limited to . . . ".

In the present disclosure, the directional terms, such as "on/up/above", "down/below", "front", "rear/back", "left", "right", etc., are only directions referring to the drawings. Therefore, the directional terms are used for explaining and not used for limiting the present disclosure. Regarding the drawings, the drawings show the general characteristics of methods, structures, and/or materials used in specific embodiments. However, the drawings should not be construed as defining or limiting the scope or properties encompassed by these embodiments. For example, for clarity, the relative size, thickness, and position of each layer, each area, and/or each structure may be reduced or enlarged.

In the present disclosure, when a structure (or layer, or component, or substrate) is described as located on/above another structure (or layer, or component, or substrate), it may refer that the two structures are adjacent and directly connected with each other, or the two structures are adjacent and indirectly connected with each other. The two structures being indirectly connected with each other may refer that at least one intervening structure (or intervening layer, or intervening component, or intervening substrate, or intervening interval) exists between the two structures, a lower surface of one of the two structure is adjacent or directly connected with an upper surface of the intervening structure, and an upper surface of the other of the two structures is adjacent or directly connected with a lower surface of the intervening structure. The intervening structure may be a single-layer or multi-layer physical structure or a non-physical structure, and the present disclosure is not limited thereto. In the present disclosure, when a certain structure is disposed "on/above" other structures, it may refer that the certain structure is "directly" disposed on/above the other structures, or the certain structure is "indirectly" disposed on/above the other structures, i.e., at least one structure is disposed between the certain structure and the other structures.

The terms "about", "equal", "identical/the same", or "substantially/approximately" mentioned in this document generally mean being within 20% of a given value or range, or being within 10%, 5%, 3%, 2%, 1% or 0.5% of the given value or range.

Furthermore, any two values or directions used for comparison may have a certain error. If a first value is equal to a second value, it implies that there may be an error of about 10% between the first value and the second value; if a first direction is perpendicular or "substantially" perpendicular to a second direction, then an angle between the first direction and the second direction may be between 80 degrees to 100 degrees; if the first direction is parallel or "substantially" parallel to the second direction, an angle between the first direction and the second direction may be between 0 degree to 10 degrees.

Although ordinal numbers such as "first", "second", etc., may be used to describe elements in the description and the claims, it does not imply and represent that there have other previous ordinal number. The ordinal numbers do not represent the order of the elements or the manufacturing order of the elements. The ordinal numbers are only used for discriminate an element with a certain designation from another element with the same designation. The claims and the description may not use the same terms. Accordingly, a first element in the description may be a second element in the claims.

In addition, the term "a given range is from a first value to the second value" or "a given range falls within a range from a first value to a second value" refers that the given range includes the first value, the second value and other values therebetween.

Moreover, the electronic device of the present disclosure may include a display device, a backlight device, an antenna device, a sensing device, a tiled device, a touch display device, a curved display device or a free shape display device, but not limited thereto. The electronic device may exemplarily include liquid crystal, light emitting diode, fluorescence, phosphor, other suitable display media or a combination thereof, but not limited thereto. The display device may be a non-self-luminous type display device or a self-luminous type display device. The antenna device may be a liquid-crystal-type antenna device or a non-liquid-crystal-type antenna device. The sensing device may be a device for sensing capacitance, light, thermal or ultrasonic, but not limited thereto. The electronic components of the electronic device may include passive components and active components, such as capacitors, resistors, inductors, diodes, transistors, etc., but not limited thereto. The diode may include a light emitting diode (LED) or a photodiode. The light emitting diode may include organic light emitting diode (OLED), mini LED, micro LED or quantum dot LED, but not limited thereto. The tiled device may exemplarily be a tiled display device or a tiled antenna device, but not limited thereto. Furthermore, the electronic device may be any combination of aforementioned devices, but not limited thereto. Furthermore, the electronic devices may be foldable or flexible electronic devices. The electronic device may be any combination of aforementioned devices, but not limited thereto. Furthermore, a shape of the electronic device may be a rectangle, a circle, a polygon, a shape with curved edge or other suitable shape. The electronic device may have peripheral systems, such as a driving system, a control system, a light system, etc., for supporting the display device, the antenna device, the wearable device (for example, including an augmented reality (AR) device or a virtual reality (VR) device), the vehicle-mounted device (for example, including a windshield of a vehicle) or the tiled device.

In the present disclosure, it should be understood that a depth, a thickness, a width or a height of each element, or a space or a distance between elements may be measured by an optical microscopy (OM), a scanning electron microscope (SEM), a film thickness profiler (α-step), an ellipsometer or other suitable methods. In some embodiments, a cross-sectional image including elements to be measured can be obtained by the SEM, and the depth, the thickness, the width or the height of each element, or the space or the distance between elements can be measured thereby.

It should be noted that the technical features in different embodiments described in the following can be replaced, recombined, or mixed with one another to constitute another embodiment without departing from the spirit of the present disclosure.

Unless otherwise defined, all terms (including technical and scientific terms) used herein have the same meaning as commonly understood by a person having ordinary skill in the art to which the disclosure belongs. It can be understood that these terms, such as those defined in commonly used dictionaries, should be interpreted as having meanings consistent with the background or context of the related technology and the present disclosure, and should not be interpreted in an idealized or overly formal manner, unless otherwise specified in the disclosed embodiments.

In the present disclosure, the following drawings are described in conjunction with the XYZ Cartesian coordinate system for the sake of convenience. In the present disclosure, the terms such as "space" or "distance" between elements and "width" or "length" of the element are defined by the projection of the element on the XY plane, YZ plane or XZ plane along the X direction, the Y direction or the Z direction. Similarly, terms such as "parallel" or "non-parallel" used herein refers to the projections of the extending lines of the elements on the XY plane, the YZ plane, or the XZ plane are "parallel" or "non-parallel".

In the present disclosure, for the sake of convenience, the first direction is exemplified by the direction X, the second direction is exemplified by the direction Y, but not limited thereto. For example, in some embodiments, the first direction may be the direction Y or other directions, and the second direction may correspondingly be the direction X or other directions perpendicular to the first direction.

In the present disclosure, two identical elements "disposed adjacent to each other" or "adjacently disposed" refers that there is no other identical elements (such as elements with the same function) disposed therebetween.

Figure 2:
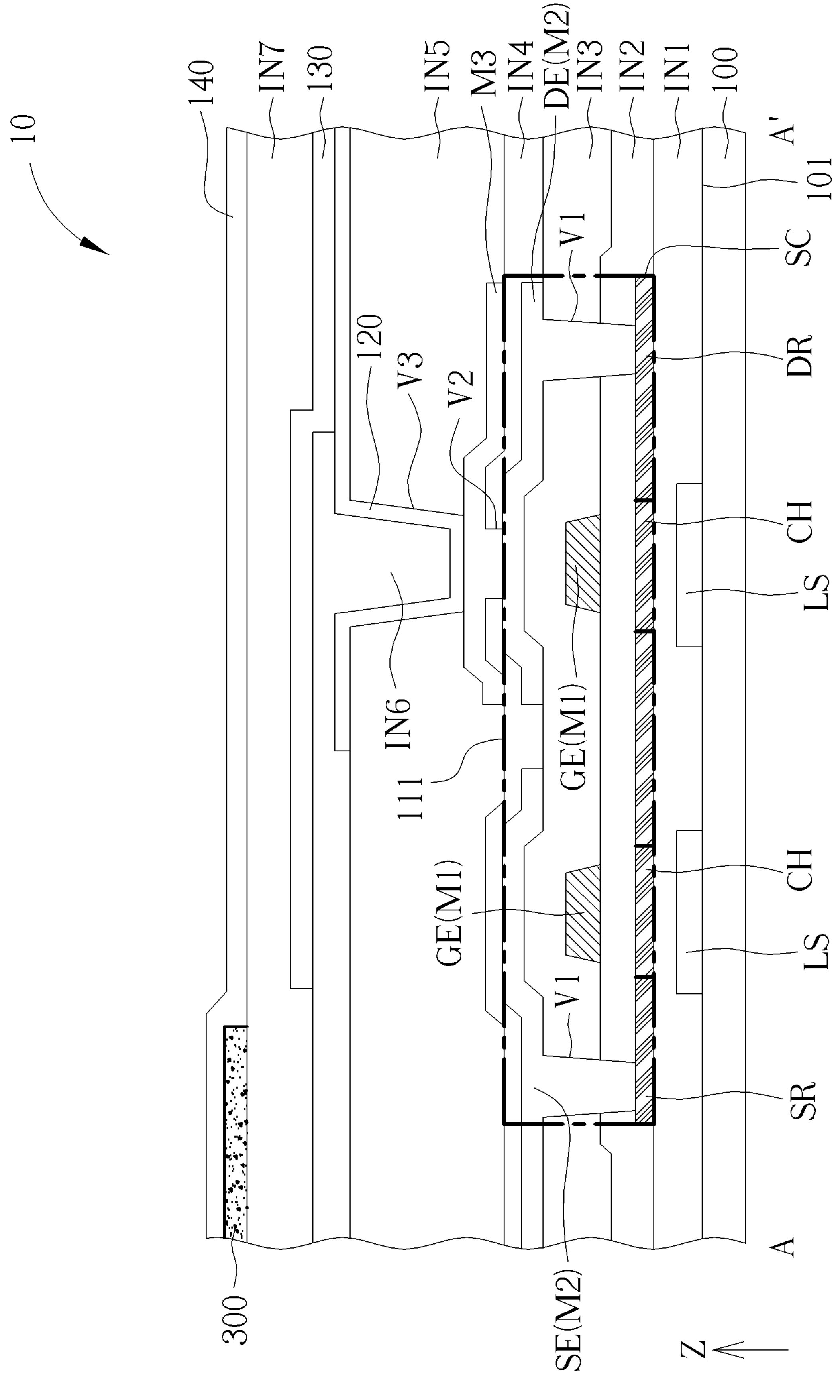
FIG. 2 schematic diagram showing a partial is a cross-sectional view taken along line A-A' of the electronic device shown in FIG. 1.

Please refer to FIG. 1 and FIG. 2, FIG. 1 is a schematic diagram showing a partial top view of an electronic device 10 according to an embodiment of the present disclosure, and FIG. 2 is a schematic diagram showing a partial cross-sectional view taken along line A-A' of the electronic device 10 shown in FIG. 1. The electronic device 10 may include a substrate 100, data lines DL, scan lines SL, opening regions 200 and light shielding patterns 300. The data lines DL are disposed on the substrate 100, the scan lines SL are disposed on the substrate 100, in which two adjacent data lines DL and two adjacent scan lines SL define a pixel 11, and each of the scan lines SL extends along a first direction (such as the direction X). In some embodiments, two adjacent scan lines SL are two scan lines with the same function, and there are no other scan lines with the same function as that of the aforementioned two scan lines disposed therebetween; two adjacent data lines DL are two data lines with the same function, and there are no other data lines with the same function as that of the aforementioned two data lines disposed therebetween, but the present disclosure is not limited thereto. The opening region 200 is disposed corresponding to the pixel 11. The opening region 200 has a first edge 210 and a second edge 220. The first edge 210 and the second edge 220 are disposed opposite to each other and extend along the first direction. There is a spaced distance L1 between the first edge 210 and the second edge 220 in a second direction (such as the direction Y) perpendicular to the first direction. In some embodiments, the first edge 210 and the second edge 220 are arc-shaped edges. When the first edge 210 and the second edge 220 are arc-shaped edges, the maximum distance between the first edge 210 and the second edge 220 in the second direction (such as the direction Y) perpendicular to the first direction is the spaced distance L1. The light shielding pattern 300 is disposed adjacent to the opening region 200. The light shielding pattern 300 includes a first portion 310 located between a first extending line 212 of the first edge 210 and a second extending line 222 of the second edge 220. A ratio of a width W1 of the first portion 310 in the second direction to the spaced distance L1 is from 0.3 to 0.7 (i.e., $0.3 \leq W1/L1 \leq 0.7$). Thereby, the electronic device 10 can achieve balance between the color shift and the opening rate.

Specifically, in the embodiment, the electronic device 10 is applied as a display device, but not limited thereto. The electronic device 10 may also include other functions, such as touch and detection, but not limited thereto. In some embodiments, the electronic device 10 may include a virtual reality electronic device. The electronic device 10 includes a plurality of pixels 11. The plurality of pixels 11 are arranged along the first direction and the second direction to form a pixel matrix. Herein, the first pixel 11*a*, the second pixel 11*b* and the third pixel 11*c* arranged along the first direction are labeled exemplarily. The first pixel 11*a* is, for example, a red pixel (represented by R in the drawing), the second pixel 11*b* is, for example, a green pixel (represented by G in the drawing), and the third pixel 11*c* is, for example, a blue pixel (represented by B in the drawing). The plurality of pixels 11 arranged along the second direction, for example, have the same color, but not limited thereto. In other embodiments, the first pixel 11*a*, the second pixel 11*b* and the third pixel 11*c* may be configured as pixels 11 having other colors. Alternatively, at least two of the first pixel 11*a*, the second pixel 11*b* and the third pixel 11*c* may have the same color. As another example, the plurality of pixels 11 arranged along the second direction may have different colors. The shapes of different pixels 11 may be adjusted according to product requirements. Herein, the electronic device 10 is exemplarily a flat electronic device, but not limited thereto. In other embodiments of the present disclosure, the electronic device 10 may be a non-flat electronic device such as a curved electronic device.

Figure 12:
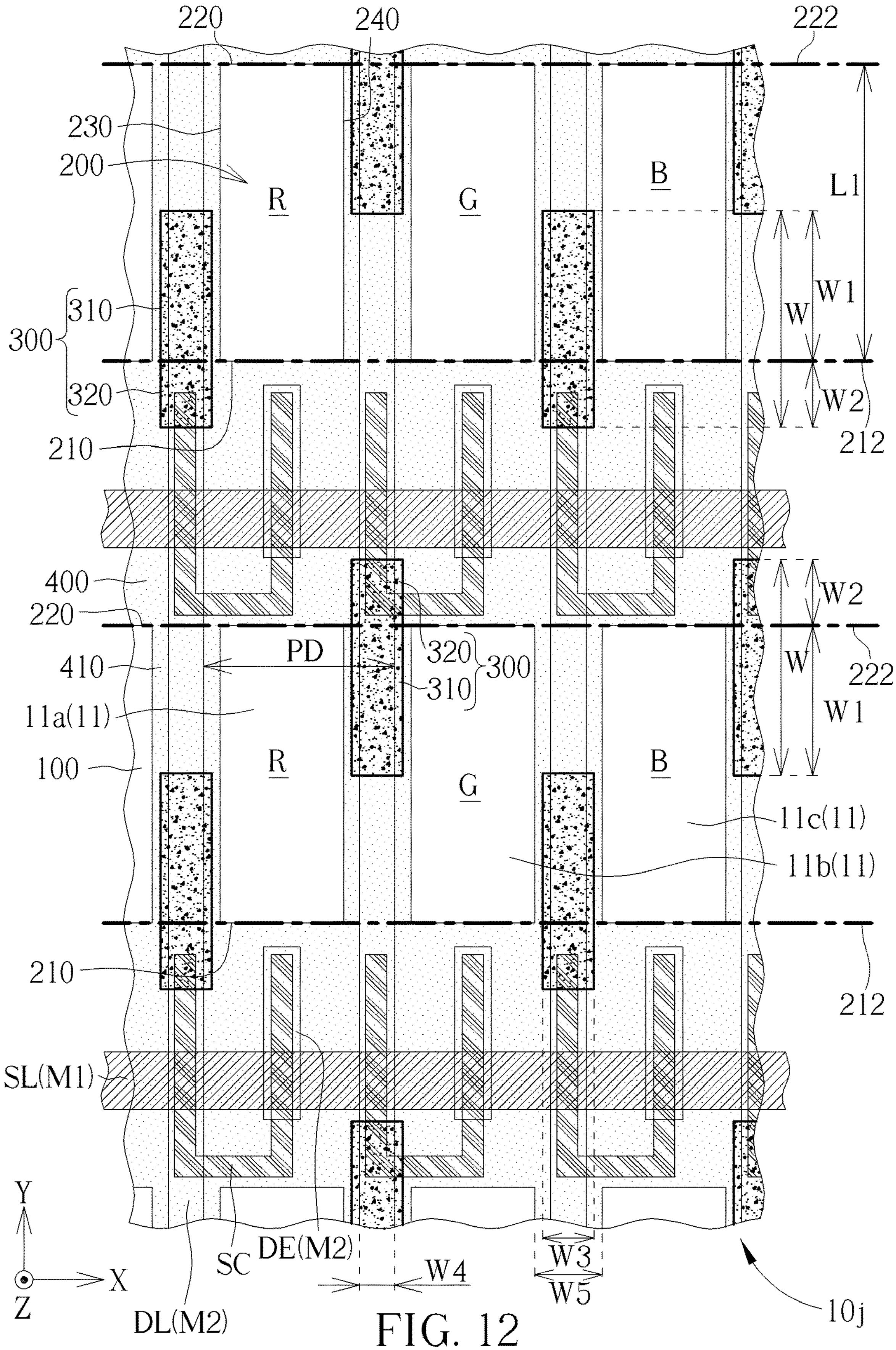
FIG. 12 is a schematic diagram showing a partial top view of an electronic device according to yet another embodiment of the present disclosure.

The material of the light shielding pattern 300 may include a metal material, a black resin or a combination thereof. In FIG. 1, at least one of the light shielding patterns 300 may be, for example, disposed on one of the plurality of data lines. A width W3 of the at least one of the light shielding patterns 300 in the first direction may be greater than a width W4 of the one of the plurality of data lines DL in the first direction (i.e., $W3 > W4$). In the embodiment, the plurality of light shielding patterns 300 are all disposed on the data lines DL, but not limited thereto. The light shielding pattern 300 may further include a second portion 320. The second portion 320 is connected with the first portion 310 and protrudes from the first extending line 212 of the first edge 210 along the second direction. For example, the second portion 320 is located between the first portion 310 and the scan line SL. In the embodiment, the second portions 320 of the plurality of light shielding patterns 300 all protrude from the first extending line 212 of the first edge 210 along the second direction, but not limited thereto. In some variant embodiments, as shown in FIG. 12, in the electronic device 10*j*, the second portions 320 of a part of the plurality of light shielding patterns 300 may protrude from the first extending line 212 of the first edge 210 along the second direction, while the second portions 320 of another part of the plurality of light shielding patterns 300 may protrude from the second extending line 222 of the second edge 220 along the second direction. For example, in FIG. 12, the second portion 320 of the light shielding pattern 300 located at the left side of the first pixel 11*a* and adjacent to the first pixel 11*a* may protrude from the first extending line 212 of the first edge 210 in the second direction, the second portion 320 of the light shielding pattern 300 located at the left side of the second pixel 11*b* and adjacent to the second pixel 11*b* may protrude from the second extending line 222 of the second edge 220 along the second direction, and the second portion 320 of the light shielding pattern 300 located at the left side of the third pixel 11*c* and adjacent to the third pixel 11*c* may protrude from the first extending line 212 of the first edge 210 in the second direction. That is, the plurality of light shielding patterns 300 may be configured to stagger up and down along the first direction, but not limited thereto. In other variant embodiments, the second portions 320 of the plurality of light shielding patterns 300 may all protrude from the second extending line 222 of the second edge 220 along the second direction (not shown). In other words, the second portions 320 of the light shielding patterns 300 protruding from the first extending line 212 of the first edge 210 along the second direction or protruding from the second extending line 222 of the second edge 220 along the second direction may be adjusted according to actual needs. A width W of the light shielding pattern 300 in the second direction may be the sum of the width W1 of the first portion 310 in the second direction and the width W2 of the second portion 320 in the second direction (i.e., $W = W1 + W2$). For example, the width W may be less than the spaced distance L1 (i.e., W<L1), but not limited thereto.

In the embodiment, a light shielding layer LS, an insulating layer IN1, a semiconductor layer SC, an insulating layer IN2, a first metal layer M1, an insulating layer IN3, a second metal layer M2, an insulating layer IN4, a third metal layer M3, an insulating layer IN5, a first transparent conductive layer 120, an insulating layer IN6, a second transparent conductive layer 130, an insulating layer IN7, a light shielding pattern 300 and a third transparent conductive layer 140 are formed on the surface 101 of the substrate 100 from bottom to top. The light shielding layer LS may be disposed on the surface 101 of the substrate 100. The insulating layer IN1 may be disposed on the light shielding layer LS. The semiconductor layer SC may be disposed on the insulating layer IN1. The semiconductor layer SC may include a drain region DR and a source region SR doped with dopants, and a channel region CH located between the drain region DR and the source region SR. The insulating layer IN2 is disposed on the semiconductor layer SC and may be served as the gate dielectric layer of the thin-film transistor 111. The first metal layer M1 is disposed on the insulating layer IN2. The first metal layer M1 may be formed into a plurality of scan lines SL (as shown in FIG. 1). A portion of the scan line SL may be served as the gate electrode GE of the thin-film transistor 111. The gate electrode GE may be substantially corresponding to the channel region CH. The insulating layer IN3 may be disposed on the first metal layer M1. The second metal layer M2 may be disposed on the insulating layer IN3. The second metal layer M2 may be formed into a plurality of data lines DL (as shown in FIG. 1) and a plurality of drain electrodes DE. A portion of the data line DL may be served as the source electrode SE of the thin-film transistor 111. The insulating layer IN2 and the insulating layer IN3 may be formed with a plurality of vias V1. The source electrode SE and the drain electrode DE may be electrically connected with the source region SR and the drain region DR through the vias V1, respectively. The insulating layer IN4 may be disposed on the second metal layer M2. The thin-film transistor 111 may include the semiconductor layer SC, the gate electrode GE, the source electrode SE and the drain electrode DE. Moreover, the thin-film transistor 111 may be served as a driving element. In FIG. 1, the scan line SL extends along the first direction, the data line DL extends along the second direction and intersects with the scan line SL, but not limited thereto. For example, in some embodiment, the extending direction of the data line DL may not be perpendicular to the extending direction of the scan line SL.

The electronic device 10 may optionally include the third metal layer M3 and the insulating layer IN4. The third metal layer M3 is disposed on the insulating layer IN4 corresponding to the drain electrode DE. The insulating layer IN4 may be formed with the via V2, and the third metal layer M3 is electrically connected with the drain electrode DE through the via V2. The insulating layer IN5 is disposed on the third metal layer M3 and the insulating layer IN4, and the insulating layer IN5 may be formed with the via V3. The first transparent conductive layer 120 is disposed on the insulating layer IN5, in which a portion of the first transparent conductive layer 120 is disposed in the via V3 and is electrically connected with the third metal layer M3 through the via V3. Thereby, the third metal layer M3 can provide a larger area for contacting the first transparent conductive layer 120. When the contact area is larger, the electron transport amount is higher, which is beneficial to improve and stabilize the electron transport between the first transparent conductive layer 120 and the drain electrode DE, and reduce the resistance between the first transparent conductive layer 120 and the drain electrode DE. Accordingly, the display quality can be improved. In the embodiment, the first transparent conductive layer 120 is electrically connected with the drain electrode DE through the third metal layer M3. In some embodiments, the electronic device 10 may not include the third metal layer M3, and the first transparent conductive layer 120 may be electrically connected with the drain electrode DE directly.

The insulating layer IN6 is disposed on the first transparent conductive layer 120 and the insulating layer IN5, and a portion of the insulating layer IN6 is disposed in the via V3. The second transparent conductive layer 130 may be electrically connected with the thin-film transistor 111/drain electrode DE through the first transparent conductive layer 120 and the third metal layer M3. The second transparent conductive layer 130 may be, for example, a pixel electrode. The insulating layer IN7 is disposed on the second transparent conductive layer 130 and the insulating layer IN6. The light shielding pattern 300 is disposed on the insulating layer IN7. The third transparent conductive layer 140 is disposed on the insulating layer IN7 and the light shielding pattern 300. The third transparent conductive layer 140 may be, for example, a common electrode. In some embodiments, the second transparent conductive layer 130 may be disposed optionally.

In the embodiment, the substrate 100 is, for example, an array substrate or a driving substrate. The aforementioned driving substrate refers to a substrate on which a thin-film transistor (TFT) 111 and/or a driving circuit are formed, but not limited thereto.

The electronic device 10 may further include an opposite substrate (not shown). The opposite substrate (not shown) is disposed corresponding to the substrate 100. In some embodiments, the electronic device 10 may further include a display medium layer (not shown) disposed between the substrate 100 and the opposite substrate. For example, the display medium layer is a liquid crystal layer, but not limited thereto. In some embodiments, the electronic device 10 may further include a sealant layer (not shown) disposed between the substrate 100 and the opposite substrate. The sealant layer may be used to bond the substrate 100 and the opposite substrate, so as to encapsulate the display medium layer between the substrate 100 and the opposite substrate.

The electronic device 10 may further include a light shielding layer 400 (shown in FIG. 1) and a color filter layer (not shown) formed on the opposite substrate. The light shielding layer 400 may include a light shielding material, such as a black matrix, but not limited thereto. The color filter layer, for example, may include photoresist layers having different colors formed by photoresist materials. For example, the color filter layer may include a red photoresist layer, a blue photoresist layer and/or a green photoresist layer (not shown), but not limited thereto. At least a portion of the color filter layer may overlap the opening region 200 to adjust the color of light passing through the opening region 200. In the embodiment, the first pixel 11*a*, the second pixel 11*b*, and the third pixel 11*c* may respectively correspond to the red photoresist layer, the green photoresist layer, and the blue photoresist layer of the color filter layer, but not limited thereto. After the substrate 100 is combined with the opposite substrate, the light shielding layer 400 and the color filter layer are disposed between the substrate 100 and the opposite substrate. Therefore, the light shielding layer 400 and the color filter layer may also be regarded as being disposed on (the surface 101 of) the substrate 100.

In some embodiments, at least parts of the layers and/or elements on the opposite substrate may be disposed on the substrate 100, but not limited thereto. In addition, one side of the electronic device 10 may be disposed with a backlight element (not shown). For example, the backlight element may be disposed below the substrate 100. The backlight element may include light emitting diodes (LEDs), submillimeter light emitting diodes (mini LEDs), micro light emitting diodes (micro LEDs), quantum dots (QDs), quantum dot light emitting diodes (QLEDs, QD-LEDs), fluorescence, phosphor, other suitable materials, or a combination thereof, but not limited thereto.

The substrate 100 and the opposite substrate may exemplary be flexible or inflexible substrates. The substrate 100 and the opposite substrate may be transparent substrates, and the materials thereof may exemplarily include glass, quartz, sapphire, polyimide (PI), polycarbonate (PC), polyethylene terephthalate (PET), other suitable materials or a combination thereof, but not limited thereto. The material of the light shielding layer LS may exemplarily include metal. The materials of the insulating layer IN1, the insulating layer IN2, the insulating layer IN3, the insulating layer IN4 and the insulating layer IN7, may include, for example, inorganic materials (such as silicon oxide, silicon nitride, silicon oxynitride, or stacking layers including at least two of the aforementioned materials). The materials of the insulating layer IN5 and the insulating layer IN6, may include, for example, organic materials (such as photoresist materials, polyimide resin, epoxy resin, acrylic resin, other suitable materials or a combination thereof), or may include low-reflective metal or inorganic materials when requirement of electricity or material hardness is need, but not limited thereto. The material of the semiconductor layer SC may include, for example, amorphous silicon, low temperature polysilicon (LTPS), metal oxides (such as indium gallium zinc oxide (IGZO)), other suitable materials or a combination thereof. The materials of the first metal layer M1, the second metal layer M2 and the third metal layer M3 may include, for example, metal materials. The metal materials may include, for example, aluminum, molybdenum, copper, titanium, other suitable materials or a combination of at least two thereof, but not limited thereto. The materials of the first transparent conductive layer 120, the second transparent conductive layer 130 and the third transparent conductive layer 140 may include, for example, indium tin oxide (ITO), but not limited thereto.

For the sake of simplification, FIG. 1 mainly shows the substrate 100, the semiconductor layers SC, the scan lines SL, the data lines DL, the drain electrodes DE, the light shielding layer 400, and the light shielding patterns 300 of the electronic device 10, and other elements of the electronic device 10 are omitted. In addition, FIG. 1 only shows a portion of the electronic device 10. The electronic device 10 may have a plurality of the portions shown in FIG. 1 as repeating units, which are arranged along the first direction to extend leftward and rightward and along the second direction to extend upward and downward. FIG. 3 to FIG. 12 below are also similar to FIG. 1, and only a portion of each of the electronic devices 10*a*, 10*b*, 10*c*, 10*d*, 10*e*, 10*f*, 10*g*, 10*h*, 10*i* and 10*j* are shown, and are not repeated below.

In addition to the above elements and/or film layers, the electronic device 10 of the embodiment may also include other suitable elements and/or film layers according to design requirements.

In the present disclosure, the pixel 11 may refer to the region surrounded by the same edges (left edges or right edges) of two adjacent data lines DL and the same edges (upper edges or lower edges) of two adjacent scan lines SL, or the region surrounded by central lines (not shown) of two adjacent data lines DL and central lines (not shown) of two adjacent scan lines SL.

In the present disclosure, the pixel pitch PD, taking the first direction as an example, may refer to the distance between the same edges (left edges or right edges) of two adjacent data lines DL or the distance between two central lines (not shown) of two adjacent data lines DL. In FIG. 1, the pixel pitch PD is exemplarily the distance between two right edges of two adjacent data lines DL.

In the present disclosure, the opening region 200 is, for example, a region that allows backlight (such as the light emitted by a backlight element) to penetrate. In the embodiment, the opening region 200 is, for example, defined by the light shielding layer 400, but not limited thereto. In other embodiments, the opening region 200 may be defined by the light shielding layer 400, the data line DL, the scan line SL, other light shielding layers (not shown, such as other metal layers disposed on the substrate 100), or a combination thereof. For example, the first edge 210 and the second edge 220 of the opening region 200 along the first direction may be defined by the light shielding layer LS, and the third edge 230 and the fourth edge 240 of the opening region 200 along the second direction may be defined by the light shielding layer 400. As another example, the first edge 210 and the second edge 220 of the opening region 200 along the first direction may be defined by the scan lines SL, and the third edge 230 and the fourth edge 240 of the opening region 200 along the second direction may be defined by the data lines DL.

Figure 3:
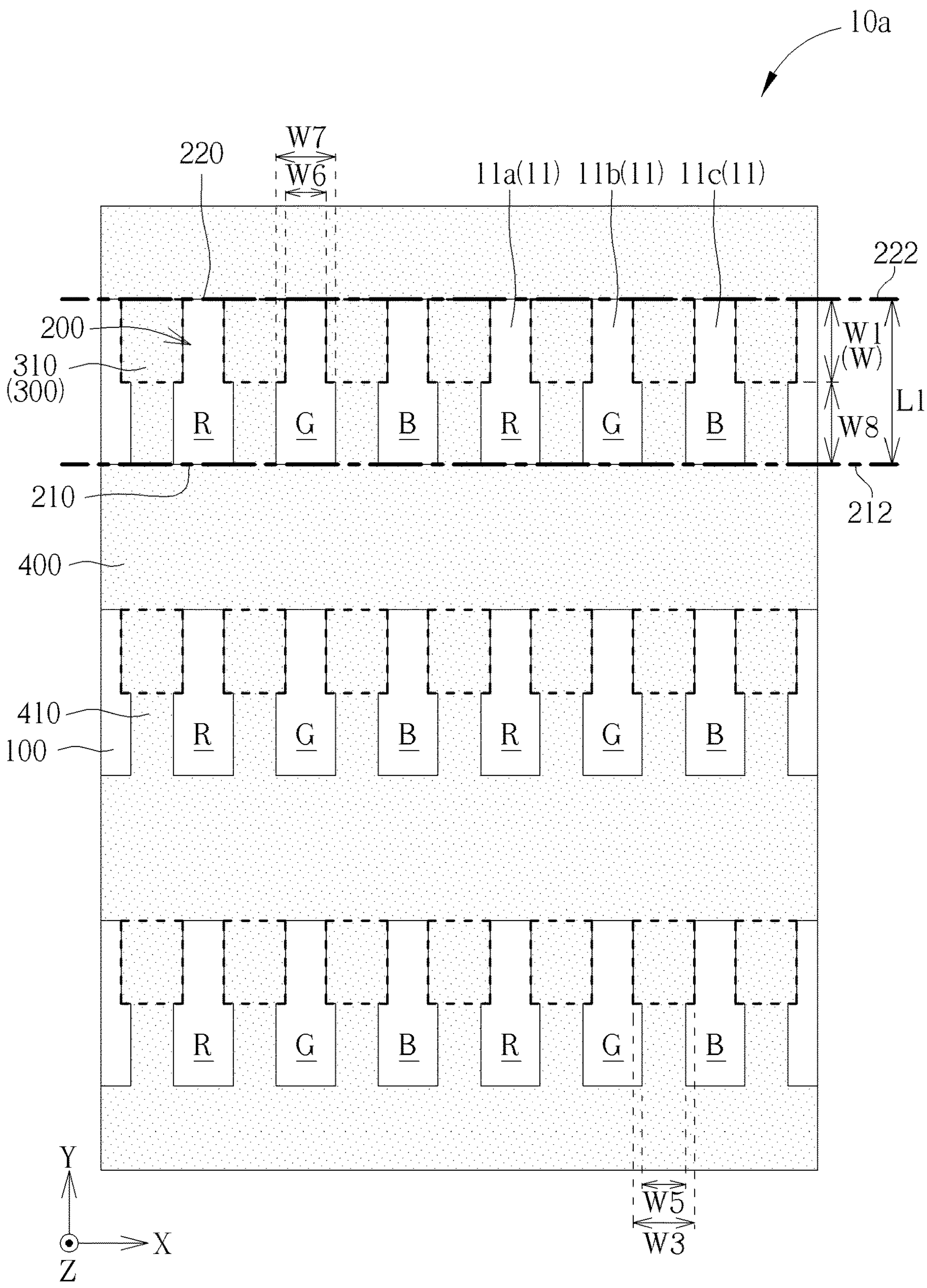
FIG. 3 is a schematic diagram showing a partial top view of an electronic device according to another embodiment of the present disclosure.

Please refer to FIG. 3, which is a schematic diagram showing a partial top view of an electronic device 10*a* according to another embodiment of the present disclosure. For the sake of simplification, FIG. 3 further omits elements such as the semiconductor layers SC, the scan lines SL, the data lines DL and the drain electrodes DE compared with FIG. 1. In addition, in the FIG. 4 to FIG. 11 below, the aforementioned elements are also omitted. For details of the aforementioned elements, references may be made to the above description and are not repeated herein.

In the embodiment, the light shielding pattern 300 may be a portion of the light shielding layer 400. For example, the light shielding pattern 300 may be disposed on the surface of the opposite substrate, but not limited thereto. The light shielding pattern 300 (i.e., the range enclosed by the dotted line) includes the first portion 310. In the embodiment, the light shielding pattern 300 exemplarily only includes the first portion 310. Therefore, the width W1 of the first portion 310 in the second direction is equal to the width W of the light shielding pattern 300 in the second direction. Similar to the electronic device 10 shown in FIG. 1, the ratio of the width W1 of the first portion 310 in the second direction to the spaced distance L1 may be from 0.3 to 0.7 (i.e., $0.3 \leq W1/L1 \leq 0.7$). The light shielding layer 400 is disposed on the substrate 100. The light shielding layer 400 includes a connecting portion 410 located between the first extending line 212 of the first edge 210 and the second extending line 222 of the second edge 220 of a same opening region 200, and the connecting portion 410 is disposed adjacent to the opening region 200. The light shielding pattern 300 is connected with the connecting portion 410. The width W3 of the light shielding pattern 300 in the first direction may be greater than the width W5 of the connecting portion 410 in the first direction. The ratio of the width W3 to the width W5 may be greater than 1 and less than or equal to 2 (i.e., $1 < W3/W5 \leq 2$) or greater than 1 and less than or equal to 1.5

(i.e., 1<W3/W5≤1.5). A same opening region 200 may have the first width W6 and the second width W7 in the first direction corresponding to the light shielding pattern 300 and the connecting portion 410. The first width W6 may be different from the second width W7. Herein, the first width W6 is exemplarily less than the second width W7. The sum of the width W of the light shielding pattern 300 in the second direction and the width W8 of the connecting portion 410 in the second direction may be equal to the spaced distance L1. Compared with the electronic device 10 shown in FIG. 1 and FIG. 2, a portion of the connecting portion 410 of the light shielding layer 400 in FIG. 1 is widened along the first direction to be the light shielding pattern 300 of the electronic device 10*a*. The light shielding pattern 300 is a portion of the light shielding layer 400 and integrally connected with the connecting portion 410. Since the light shielding pattern 300 may be integrally formed with the light shielding layer 400, the light shielding pattern 300 is formed by the existing layer of the electronic device 10, which is beneficial to simplify the manufacturing process.

In the embodiment, the plurality of light shielding patterns 300 all extend from the second extending line 222 toward the first extending line 212 and each of which is connected with a connecting portion 410 (i.e., the portion the connecting portion 410 close to the second edge 220 shown in FIG. 1 is widened), but not limited thereto. In some variant embodiments, the plurality of light shielding patterns 300 may extend from the first extending line 212 toward the second extending line 222 and each of which is connected with a connecting portion 410 (i.e., the portion of the connecting portion 410 close to the first edge 210 shown in FIG. 1 is widened, which is not shown). In further variant embodiments, a part of the plurality of light shielding patterns 300 may extend from the second extending line 222 toward the first extending line 212 and each of which is connected with a connecting portion 410, and another part of the plurality of light shielding patterns 300 may extend from the first extending line 212 toward the second extending line 222 and each of which is connected with a connecting portion 410 (not shown). That is, the plurality of light shielding patterns 300 may be configured to stagger up and down along the first direction, but not limited thereto. In addition, in the embodiment, only one light shielding pattern 300 and one connecting portion 410 are included between the first extending line 212 and the second extending line 222, but not limited thereto. The number and arrangement of the light shielding pattern 300 and the connecting portion 410 between the first extending line 212 and the second extending line 222 may be adjusted according to actual needs. For example, in some variant embodiments, two light shielding patterns 300 and one connecting portion 410 may be included between the first extending line 212 and the second extending line 222, in which one light shielding pattern 300 extends from the first extending line 212 toward the second extending line 222, another light shielding pattern 300 extends from the second extending line 222 toward the first extending line 212, and the connecting portion 410 is disposed between the two light shielding patterns 300 (i.e., the portions of the connecting portion 410 close to the first edge 210 and the second edge 220 shown in FIG. 1 are widened). In other variant embodiments, one light shielding pattern 300 and two connecting portions 410 may be included between the first extending line 212 and the second extending line 222, in which one connecting portion 410 is connected with the first edge 210, the other connecting portion 410 is connected with the second edge 220, and the light shielding pattern 300 is disposed between the two connecting portions 410 (i.e., the portion of the connecting portion 410 close to the middle shown in FIG. 1 is widened). For other details of the electronic device 10*a*, references may be made to the related description of the electronic device 10 and are not repeated herein.

Figure 4:
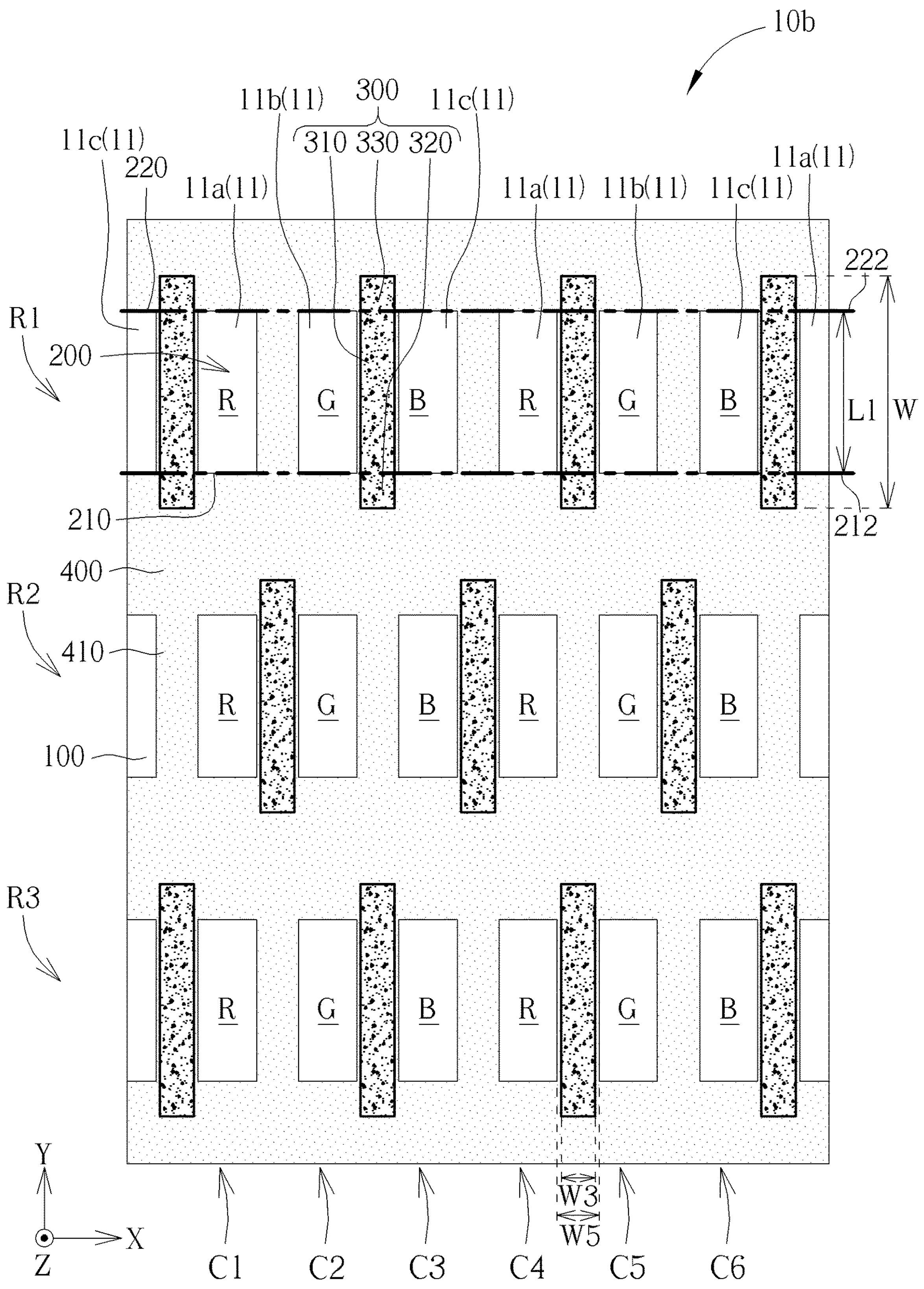
FIG. 4 is a schematic diagram showing a partial top view of an electronic device according to further another embodiment of the present disclosure.

Please refer to FIG. 4, which is a schematic diagram showing a partial top view of an electronic device 10*b* according to further another embodiment of the present disclosure. The electronic device 10*b* includes a substrate 100, a plurality of data lines DL (see FIG. 1), a plurality of scan lines SL (see FIG. 1), a plurality of opening regions 200 and a plurality of light shielding patterns 300. The plurality of data lines DL are disposed on the substrate 100, the plurality of scan lines SL are disposed on the substrate 100, in which the plurality of data lines DL and the plurality of scan lines SL define a plurality of pixels 11, and each of the plurality of scan lines SL extends along the first direction. The plurality of opening regions 200 are disposed corresponding to the plurality of pixels 11 respectively. Two light shielding patterns 300 are disposed adjacent to each other, in which in the first direction, at least two opening regions 200 of the plurality of opening regions 200 are located between the two light shielding patterns 300. In other words, at least two opening regions 200 may be disposed between two adjacent light shielding patterns 300. In the embodiment, two opening regions 200 are disposed between two adjacent light shielding patterns 300, which is exemplary and the present disclosure is not limited thereto.

Compared with the electronic device 10 shown in FIG. 1, in the electronic device 10*b*, not all the two adjacent opening regions 200 have the light shielding pattern 300 disposed therebetween in the first direction. Instead, two adjacent opening regions 200 form a units (not labeled), and every two adjacent units have a light shielding pattern 300 disposed therebetween. In other words, the light shielding patterns 300 are disposed at intervals in the first direction, and every two opening regions 200 are disposed with a light shielding pattern 300.

Among the pixels 11 of the electronic device 10*b* which are completely shown, each of the first row R1, the second row R2 and the third row R3 of the electronic device 10*b* includes, in sequence from left to right, the first pixel 11*a*, the second pixel 11*b*, the third pixel 11*c*, the first pixel 11*a*, the second pixel 11*b* and the third pixel 11*c*, and so on. The first column C1 of the electronic device 10*b* includes, in sequence from top to bottom, the first pixel 11*a*, the first pixel 11*a* and the first pixel 11*a*. The second column C2 of the electronic device 10*b* includes, in sequence from top to bottom, the second pixel 11*b*, the second pixel 11*b* and the second pixel 11*b*. The third column C3 of the electronic device 10*b* includes, in sequence from top to bottom, the third pixel 11*c*, the third pixel 11*c* and the third pixel 11*c*, and so on. As mentioned above, the first pixel 11*a* is exemplarily a red pixel, the second pixel 11*b* is exemplarily a green pixel and the third pixel 11*c* is exemplarily a blue pixel. In other words, the pixels 11 of each of the rows (such as the first row R1, the second row R2, and the third row R3) of electronic device 10*b* are configured to be the same, so that the colors of the pixels 11 in the same column (such as the first column C1, the second column C2, the third column C3, the fourth column C4, the fifth column C5 and the sixth column C6) are all the same.

In the first row R1, the light shielding patterns 300, from left to right, are sequentially disposed between the third pixel 11*c* and the first pixel 11*a*, between the second pixel 11*b* and the third pixel 11*c*, between the first pixel 11*a* and the second pixel 11*b*, between the third pixel 11*c* and the first pixel 11*a*, and so on. That is, for the pixels 11 located in the same row (such as the first row R1) and arranged along the first direction, the positions of the light shielding patterns 300 may be between two of the first pixel 11*a*, the second pixel 11*b* and the third pixel 11*c* by turns, so that it can prevent the light shielding patterns 300 from being disposed between two fixed ones of the first pixel 11*a*, the second pixel 11*b* and the third pixel 11*c*. Accordingly, it is beneficial to balance the influence of the light shielding patterns 300 on the pixels 11 of different colors.

In the first column C1, the light shielding patterns 300, from top to bottom, are sequentially disposed at the left side of the first pixel 11*a*, the right side of the first pixel 11*a*, and the left side of the first pixel 11*a*. That is, for the pixels 11 located in the same column (such as first column C1) and arranged along the second direction, the positions of the light shielding patterns 300 may be staggered left and right. Thereby, it is beneficial to provide a better visual effect.

The light shielding pattern 300 may further include a third portion 330. The third portion 330 is connected with the first portion 310 and protrudes from the second extending line 222 of the second edge 220 along the second direction. The width W of the light shielding pattern 300 in the second direction may be greater than the spaced distance L1, but not limited thereto. The width W3 of the light shielding pattern 300 in the first direction may be less than the width W5 of the connecting portion 410 in the first direction. Other details of the light shielding pattern 300 may be the same as the light shielding pattern 300 shown in FIG. 1. For example, at least one of the plurality of light shielding patterns 300 may be disposed on one of the plurality of data lines DL (see FIG. 1), and the width W3 of the at least one of the plurality of light shielding patterns 300 in the first direction may be greater than the width W4 of the one of the plurality of data lines DL in the first direction. For other details of the electronic device 10*b*, references may be made to related description of the electronic device 10 and are not repeated herein. In other embodiments, the width W3 of the light shielding pattern 300 in the first direction may be greater than the width W5 of the connecting portion 410 in the first direction, but the present disclosure is not limited thereto.

Figure 5:
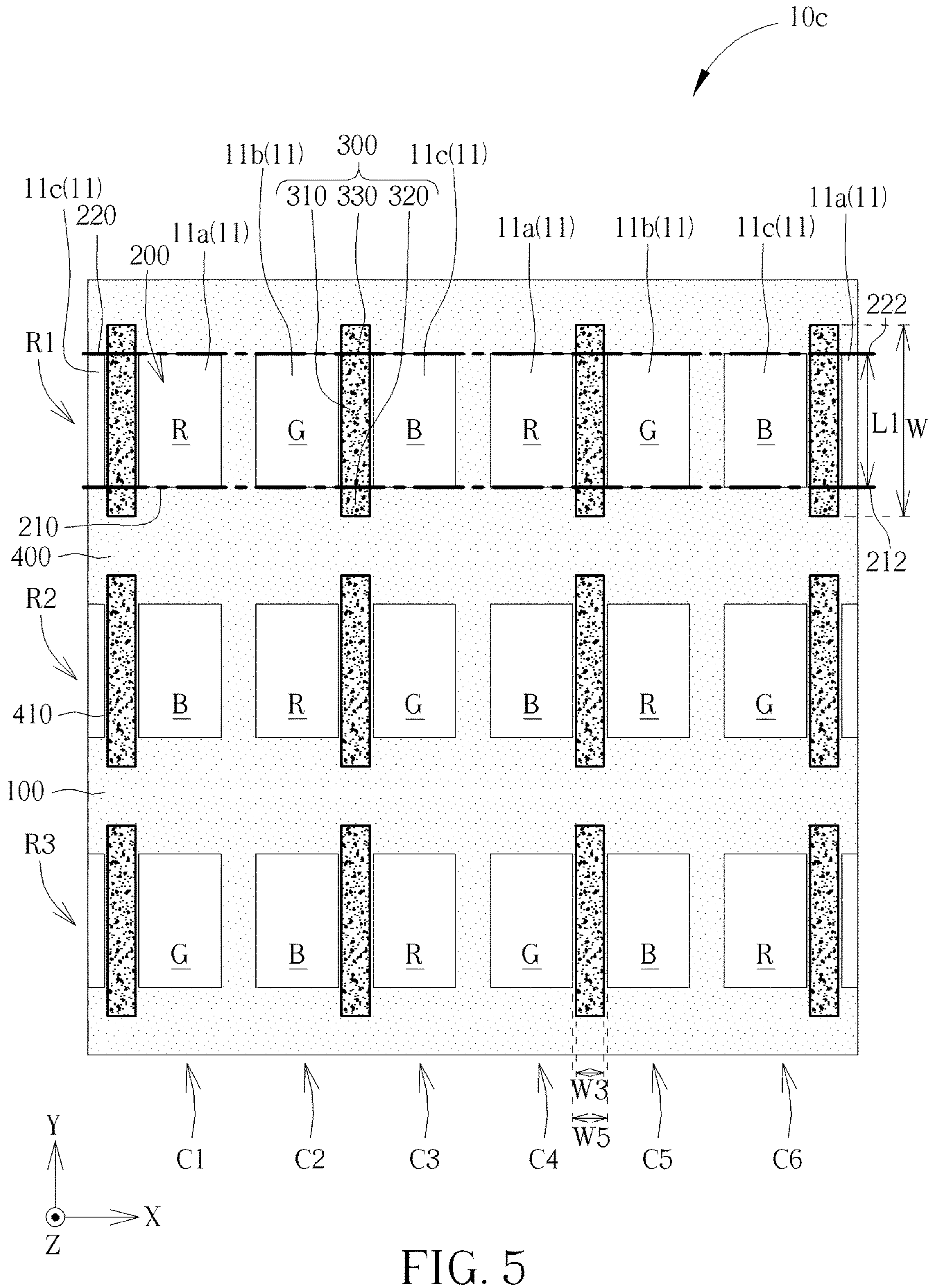
FIG. 5 is a schematic diagram showing a partial top view of an electronic device according to yet another embodiment of the present disclosure.

Please refer to FIG. 5, which is a schematic diagram showing a partial top view of an electronic device 10*c* according to yet another embodiment of the present disclosure. The main differences between the electronic device 10*c* and the electronic device 10*b* shown in FIG. 4 are the arrangement of the first pixel 11*a*, the second pixel 11*b* and the third pixel 11*c*, the electronic device 10*c* having a larger pixel pitch PD (see FIG. 1) when the pixels per inch (PPI) is the same, and the configuration, such as the disposed positions, of the light shielding patterns 300. Specifically, among the pixels 11 of the electronic device 10*c* which are completely shown, the first row R1 of the electronic device 10*c* includes, from left to right, the first pixel 11*a*, the second pixel 11*b*, the third pixel 11*c*, the first pixel 11*a*, the second pixel 11*b*, the third pixel 11*c*, and so on. The second row R2 of the electronic device 10*c* includes, from left to right, the third pixel 11*c*, the first pixel 11*a*, the second pixel 11*b*, the third pixel 11*c*, the first pixel 11*a*, the second pixel 11*b*, and so on. The third row R3 of the electronic device 10*c* includes, from left to right, the second pixel 11*b*, the third pixel 11*c*, the first pixel 11*a*, the second pixel 11*b*, the third pixel 11*c*, the first pixel 11*a*, and so on. In other words, the initial pixels 11 of the first row R1, the second row R2 and the third row R3 are different, so that the pixels 11 of the same column of the electronic device 10*c* are different (for example, the colors of the pixels 11 are different). For example, the pixels 11 of the first column C1 are, from top to bottom, the first pixel 11*a*, the third pixel 11*c* and the second pixel 11*b*. The electronic device 10*c* may be, for example, a sub pixel rendering (SPR) display device. The arrangement of the first pixels 11*a*, the second pixels 11*b* and the third pixels 11*c* shown in FIG. 5 is only exemplary. In the present disclosure, the arrangement of the first pixels 11*a*, the second pixels 11*b* and the third pixels 11*c* may be flexibly adjusted according to actual needs. The arrangement of the pixels 11 of the embodiment may also be applied to the embodiments shown in FIG. 1 and FIG. 3.

In the first row R1, the light shielding patterns 300, from left to right, are sequentially disposed between the third pixel 11*c* and the first pixel 11*a*, between the second pixel 11*b* and the third pixel 11*c*, between the first pixel 11*a* and the second pixel 11*b*, between third pixel 11*c* and the first pixel 11*a*, and so on. That is, for the pixels 11 located in the same row (such as the first row R1) and arranged along the first direction, the positions of the light shielding patterns 300 may be between two of the first pixel 11*a*, the second pixel 11*b* and the third pixel 11*c* by turns, so that it can prevent the light shielding patterns 300 from being disposed between two fixed ones of the first pixel 11*a*, the second pixel 11*b* and the third pixel 11*c*. Accordingly, it is beneficial to balance the influence of the light shielding patterns 300 on the pixels 11 of different colors. For other details of the electronic device 10*c*, references may be made to the related description of the electronic device 10*b* shown in FIG. 4 and are not repeated herein.

Figure 6:
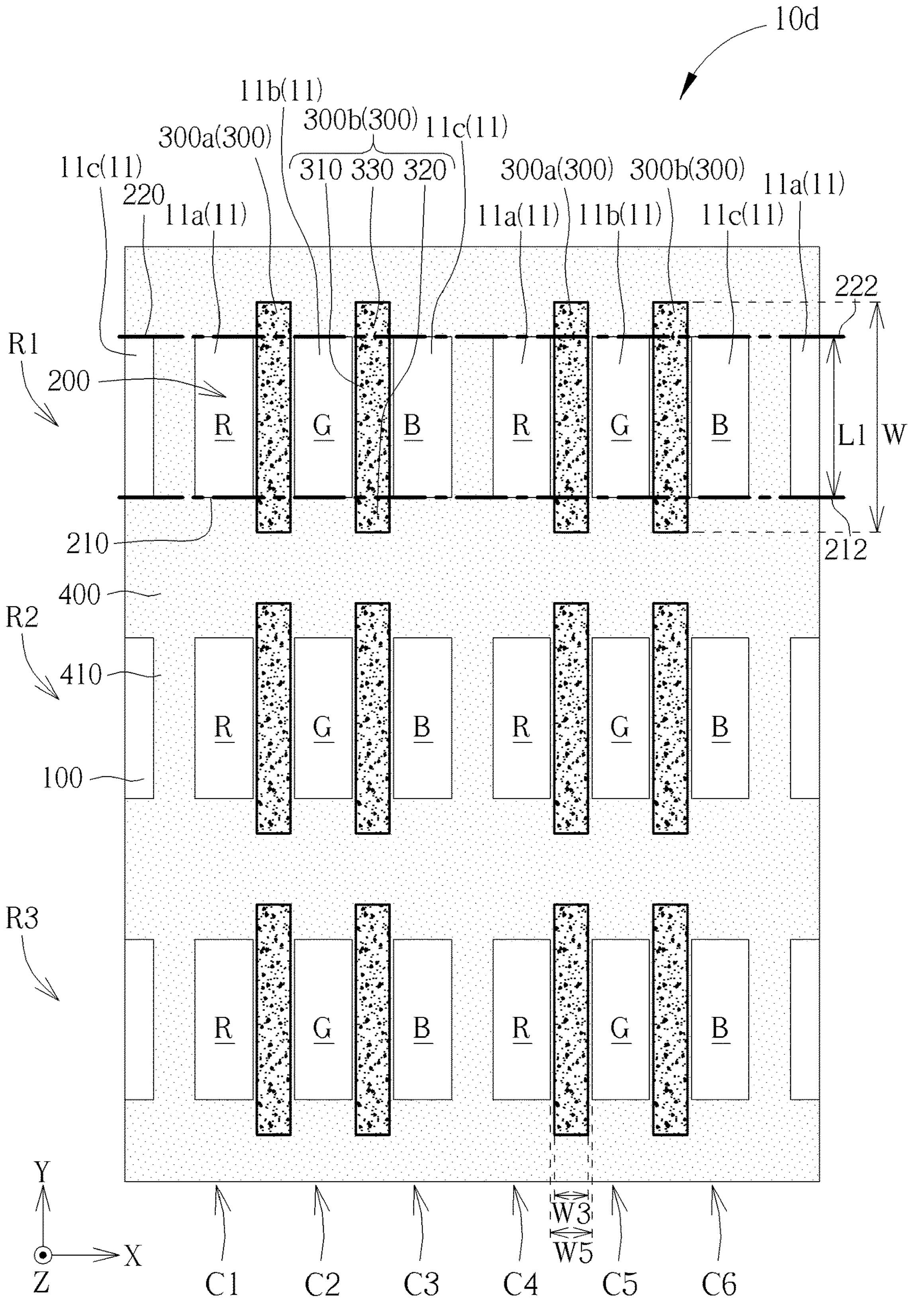
FIG. 6 is a schematic diagram showing a partial top view of an electronic device according to yet another embodiment of the present disclosure.

Please refer to FIG. 6, which is a schematic diagram showing a partial top view of an electronic device 10*d* according to yet another embodiment of the present disclosure. The main difference between the electronic device 10*d* and the electronic device 10*b* shown in FIG. 4 is the configuration, such as the disposed positions, of the light shielding patterns 300. In FIG. 4, it exemplarily shows that all the two adjacent light shielding patterns 300 have two opening regions 200 disposed therebetween. In the embodiment, it exemplarily shows that a part of the two adjacent light shielding patterns 300 have two opening regions 200 disposed therebetween, and a part of the two adjacent light shielding patterns 300 have one opening region 200 disposed therebetween.

In the embodiment, the light shielding pattern 300 at the left side of the second pixel 11*b* is named as the first light shielding pattern 300*a*, and the light shielding pattern 300 at the right side of the second pixel 11*b* is named as the second light shielding pattern 300*b* for the sake of convenience. The first pixel 11*a* may only be disposed with the light shielding pattern 300, i.e., the first light shielding pattern 300*a*, at the right side thereof, and the left side of the first pixel 11*a* may not be disposed with the light shielding pattern 300. Both the left side and the right side of the second pixel 11*b* may be disposed with the light shielding patterns 300, which are the first light shielding pattern 300*a* and the second light shielding pattern 300*b*, respectively. The third pixel 11*c* may only be disposed with the light shielding pattern 300, i.e., the second light shielding pattern 300*b*, at the left side thereof, and the right side of the third pixel 11*c* may not be disposed with the light shielding pattern 300. In other words, the light shielding pattern 300 may not be disposed between the third pixel 11*c* and the first pixel 11*a*. That is, two opening regions 200 corresponding to the third pixel 11*c* and the first pixel 11*a* are located between two adjacent light shielding patterns 300 (herein, the second light shielding pattern 300*b* at the left side of the third pixel 11*c* and the first light shielding pattern 300*a* at the right side of the first pixel 11*a*). The first light shielding pattern 300*a* at the left side of the second pixel 11*b* is disposed adjacent to the second light shielding pattern 300*b* at the right side of the second pixel 11*b*, and the first light shielding pattern 300*a* at the left side of the second pixel 11*b* and the second light shielding pattern 300*b* at the right side of the second pixel 11*b* are disposed at two opposite sides of the opening region 200 corresponding to the second pixel 11*b*.

As shown in the configuration of the light shielding patterns 300 in the electronic device 10*d*, specific pixels 11 may be disposed with the light shielding patterns 300 according to actual needs. In the embodiment, the left side and the right side of the second pixel 11*b* are disposed with the light shielding patterns 300. Alternatively, specific pixels 11 may not be disposed with the light shielding patterns 300 therebetween according to actual needs. In the embodiment, the first pixel 11*a* and the third pixel 11*c* are not disposed with the light shielding patterns 300 therebetween. For example, the first pixel 11*a* may be a red pixel, the second pixel 11*b* may be a green pixel and the third pixel 11*c* may be a blue pixel. Since the human eyes are more sensitive to light in the green band, with the left side and the right side of the second pixel 11*b* being disposed with the light shielding patterns 300, it is beneficial to reduce the rendering or color mixing of the green pixels to the pixels 11 with other colors (such as the blue pixel and the red pixel). Since the human eyes are less sensitive to light in the red band and the blue band, the first pixel 11*a* and the third pixel 11*c* may not be disposed with the light shielding patterns 300 therebetween. For other details of the electronic device 10*d*, references may be made to the related description of the electronic device 10*b* and are not repeated herein.

Figure 7:
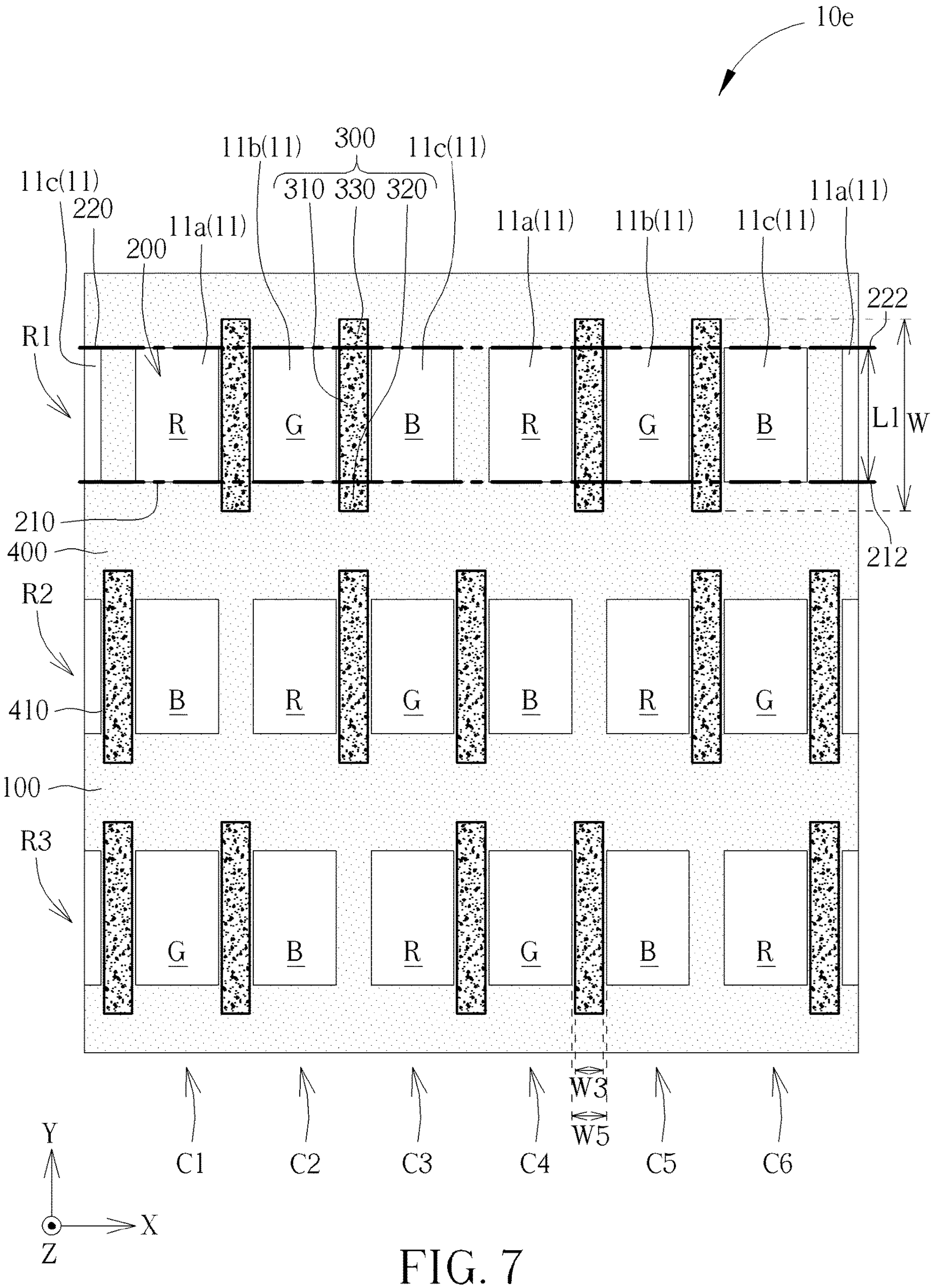
FIG. 7 is a schematic diagram showing a partial top view of an electronic device according to yet another embodiment of the present disclosure.

Please refer to FIG. 7, which is a schematic diagram showing a partial top view of an electronic device 10*e* according to yet another embodiment of the present disclosure. The main differences between the electronic device 10*e* and the electronic device 10*d* shown in FIG. 6 are the arrangement of the first pixel 11*a*, the second pixel 11*b* and the third pixel 11*c*, the electronic device 10*e* having a larger pixel pitch PD (see FIG. 1) when the pixels per inch (PPI) is the same, and the configuration, such as the disposed positions, of the light shielding patterns 300. Similar to the electronic device 10*d* shown in FIG. 6, specific pixels 11 may be disposed with the light shielding patterns 300 according to actual needs. In the embodiment, the left side and the right side of the second pixel 11*b* are exemplarily disposed with the light shielding patterns 300. Alternatively, specific pixels 11 may not be disposed with the light shielding patterns 300 therebetween according to actual needs. In the embodiment, the first pixel 11*a* and the third pixel 11*c* are exemplarily not disposed with the light shielding pattern 300 therebetween. For other details of the electronic device 10*e*, references may be made to the related description of the electronic device 10*d* and are not repeated herein.

Figure 8:
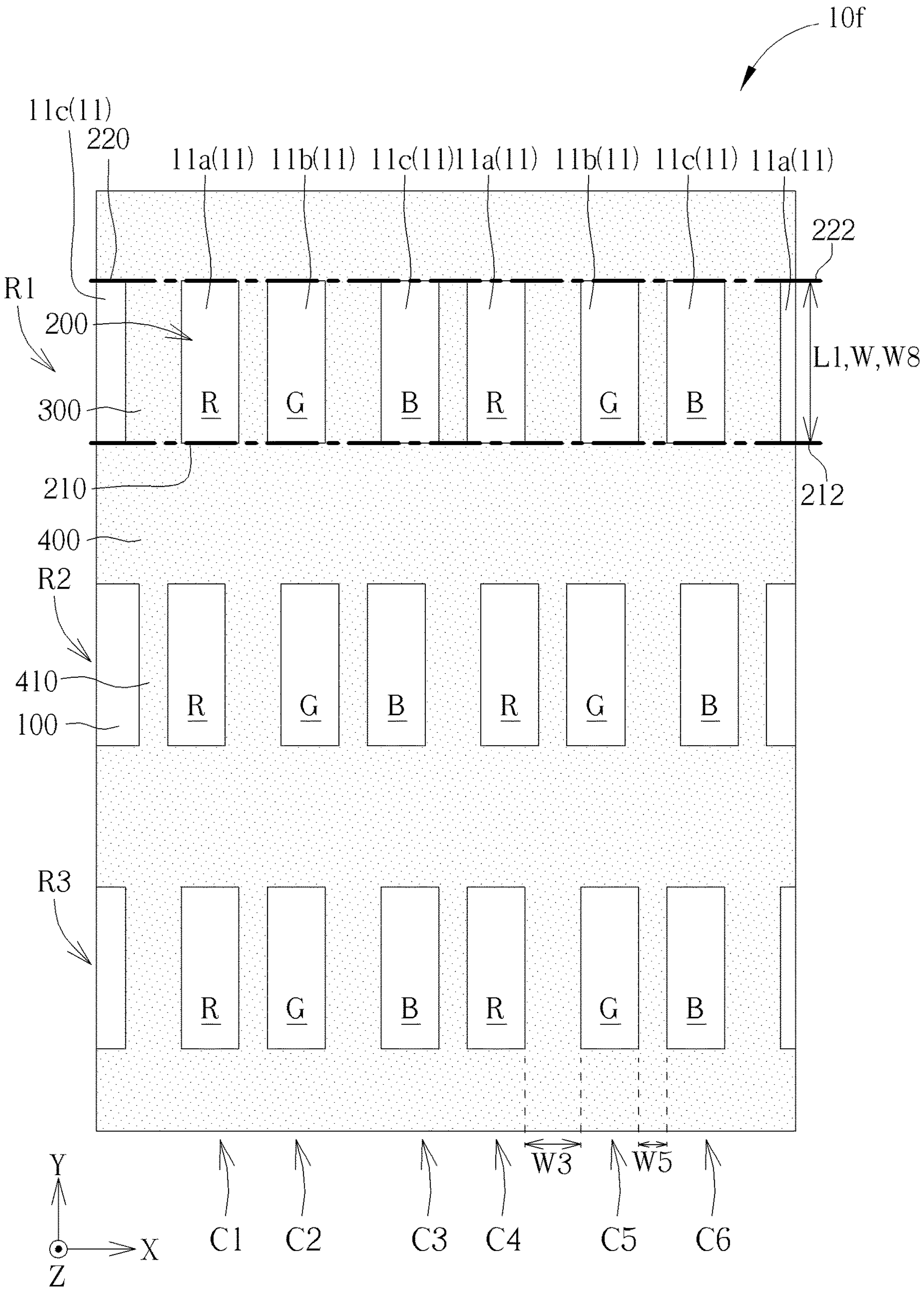
FIG. 8 is a schematic diagram showing a partial top view of an electronic device according to yet another embodiment of the present disclosure.

Please refer to FIG. 8, which is a schematic diagram showing a partial top view of an electronic device 10*f* according to yet another embodiment of the present disclosure. The main difference between the electronic device 10*f* and the electronic device 10*a* shown in FIG. 3 is the configuration of the light shielding patterns 300 and the connecting portions 410. In the electronic device 10*a* shown in FIG. 3, each light shielding pattern 300 is directly connected with a connecting portion 410, and the light shielding pattern 300 and the connecting portion 410 connected with each other are located at the same side of an opening region 200. However, in the embodiment, the light shielding pattern 300 and the connecting portion 410 are not directly connected with each other and are disposed at opposite sides of an opening region 200.

In the electronic device 10*f*, the opening region 200 has a first edge 210 and a second edge 220, and the first edge 210 and the second edge 220 are disposed opposite to each other and extend along the first direction. The light shielding layer 400 is disposed on the substrate 100. The light shielding layer 400 includes a plurality of connecting portions 410 respectively located between the first extending line 212 of the first edge 210 and the second extending line 222 of the second edge 220 of one of the plurality of opening regions 200, and the width W3 of the light shielding pattern 300 in the first direction may be greater than the width W5 of the connecting portion 410 in the first direction. The ratio of the width W3 to the width W5 is greater than 1 and less than or equal to 2 (i.e., $1<W3/L5\leq 2$) or greater than 1 and less than or equal to 1.5 (i.e., $1<W3/L5\leq 1.5$). The width W of the light shielding pattern 300 in the second direction may be equal to the width W8 of the connecting portion 410 in the second direction, and may be equal to the spaced distance L1 between the first edge 210 and the second edge 220 in the second direction. The light shielding pattern 300 may be integrally formed with the light shielding layer 400. Thereby, the light shielding pattern 300 is formed on the existing layer of the electronic device 10*f*, which is beneficial to simplify the manufacturing process.

In the electronic device 10*f*, not all the two adjacent opening regions 200 have the light shielding pattern 300 disposed therebetween in the first direction. Instead, two adjacent opening regions 200 form a units (not labeled), and every two adjacent units have a light shielding pattern 300 disposed therebetween. In other words, the light shielding patterns 300 are disposed at intervals in the first direction.

Similar to the electronic device 10*b* shown in FIG. 4, for pixels 11 located in the same row (such as the first row R1) and arranged along the first direction, the positions of the light shielding patterns 300 may be between two of the first pixel 11*a*, the second pixel 11*b* and the third pixel 11*c* by turns, so that it can prevent the light shielding patterns 300 from being disposed between two fixed ones of the first pixel 11*a*, the second pixel 11*b* and the third pixel 11*c*. Accordingly, it is beneficial to balance the influence of the light shielding patterns 300 on the pixels 11 of different colors. For pixels 11 located in the same column (such as the first column C1) and arranged along the second direction, the positions of the light shielding patterns 300 may be staggered left and right. Thereby, it is beneficial to provide a better visual effect. In addition, the light shielding patterns 300 and the connecting portions 410 are staggered in the first direction. The light shielding patterns 300 and the connecting portions 410 are staggered in the second direction. For other details of the electronic device 10*f*, references may be made to the related description of the electronic devices 10*a* and 10*b* and are not repeated herein.

Figure 9:
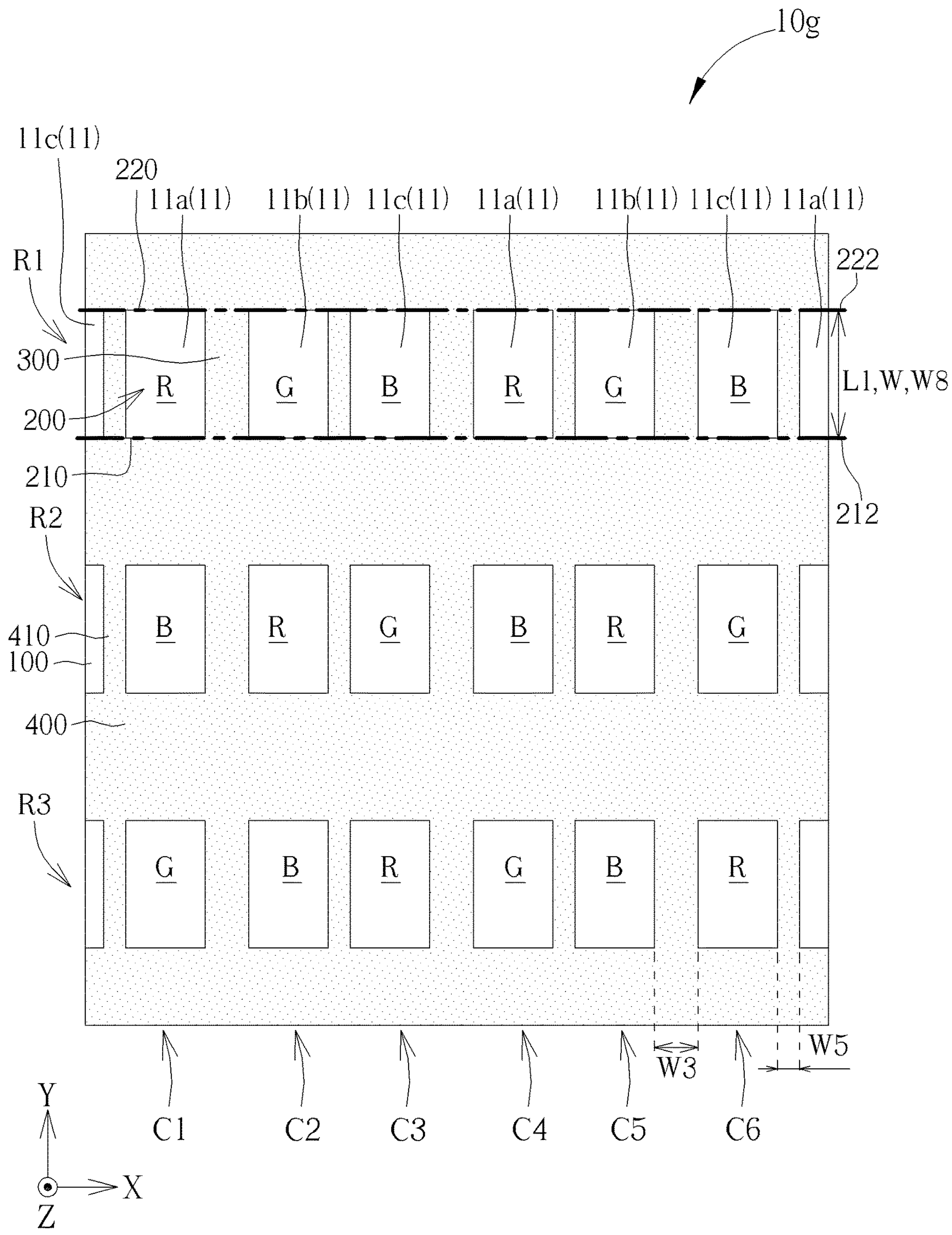
FIG. 9 is a schematic diagram showing a partial top view of an electronic device according to yet another embodiment of the present disclosure.

Please refer to FIG. 9, which is a schematic diagram showing a partial top view of an electronic device 10*g* according to yet another embodiment of the present disclosure. The main differences between the electronic device 10*g* and the electronic device 10*f* shown in FIG. 8 are the arrangement of the first pixel 11*a*, the second pixel 11*b* and the third pixel 11*c*, the electronic device 10*g* having a larger pixel pitch PD (see FIG. 1) when the pixels per inch (PPI) is the same, and the configuration, such as the disposed positions, of the light shielding patterns 300. For the arrangement of the first pixel 11*a*, the second pixel 11*b* and the third pixel 11$c$, references may be made to the related description of the electronic device 10$c$ shown in FIG. 5 and are not repeated herein.

Similar to the electronic device 10$c$ shown in FIG. 5, for pixels 11 located in the same row (such as the first row R1) and arranged along the first direction, the positions of the light shielding patterns 300 may be between two of the first pixel 11$a$, the second pixel 11$b$ and the third pixel 11$c$ by turns, so that it can prevent the light shielding patterns 300 from being disposed between two fixed ones of the first pixel 11$a$, the second pixel 11$b$ and the third pixel 11$c$. Accordingly, it is beneficial to balance the influence of the light shielding patterns 300 on the pixels 11 of different colors. In addition, the light shielding patterns 300 and the connecting portions 410 are staggered in the first direction, and the light shielding patterns 300 and the connecting portions 410 are not staggered in the second direction. For example, for the first pixel 11$a$, the third pixel 11$c$ and the second pixel 11$b$ of the first column C1 from top to bottom, the left sides thereof are all disposed with the connecting portions 410, and the right sides thereof are all disposed with the light shielding patterns 300, for the second pixel 11$b$, the first pixel 11$a$ and the third pixel 11$c$ of the second column C2 from top to bottom, the left sides thereof are all disposed with the light shielding patterns 300, and the right sides thereof are all disposed with the connecting portions 410, and so on. For other details of the electronic device 10$g$, references may be made to the related description of the electronic devices 10$c$ and 10$f$ and are not repeated herein.

Figure 10:
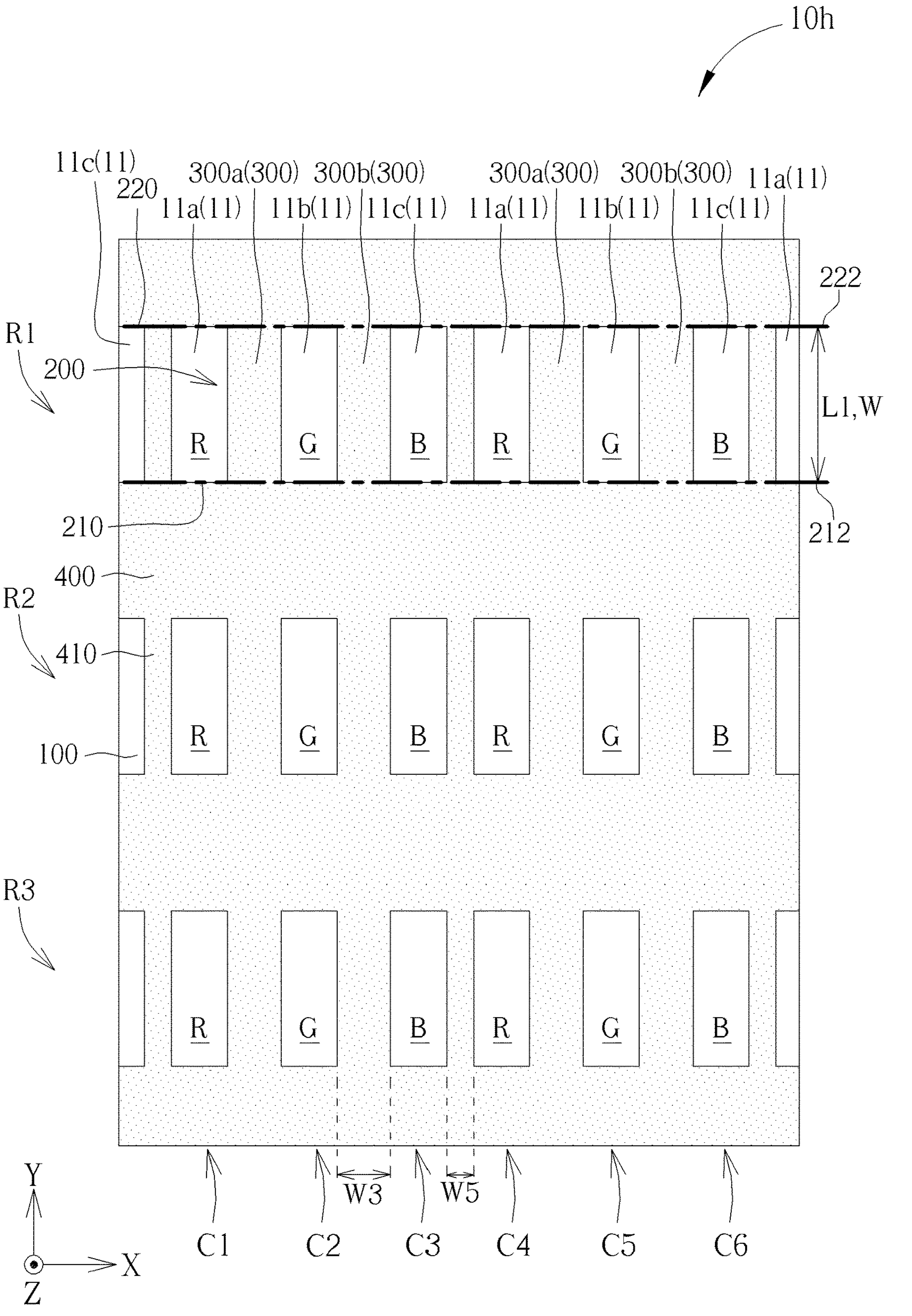
FIG. 10 is a schematic diagram showing a partial top view of an electronic device according to yet another embodiment of the present disclosure.

Please refer to FIG. 10, which is a schematic diagram showing a partial top view of an electronic device 10$h$ according to yet another embodiment of the present disclosure. The main difference between the electronic device 10$h$ and the electronic device 10$f$ shown in FIG. 8 is the configuration, such as the disposed positions, of the light shielding patterns 300. In FIG. 8, all the two adjacent light shielding patterns 300 are exemplarily disposed with two opening regions 200 therebetween. In the embodiment, a part of two adjacent light shielding patterns 300 are disposed with two opening regions 200 therebetween, while a part of two adjacent light shielding patterns 300 are disposed with one opening region 200 therebetween. Similar to the electronic device 10$d$ shown in FIG. 6, the first pixel 11$a$ may only be disposed with the light shielding pattern 300, i.e., the first light shielding pattern 300$a$, at the right side thereof, and may not be disposed with the light shielding pattern 300 at the left side thereof. The second pixel 11$b$ may be disposed with the light shielding patterns 300, i.e., the first light shielding pattern 300$a$ and the second light shielding pattern 300$b$, at the right side and the left side thereof. The third pixel 11$c$ may only be disposed with the light shielding pattern 300, i.e., the second light shielding pattern 300$b$, at the left side thereof, and may not be disposed with the light shielding pattern 300 at the right side thereof. In other words, the light shielding pattern 300 may not be disposed between the third pixel 11$c$ and the first pixel 11$a$. That is, two opening regions 200 corresponding to the third pixel 11$c$ and the first pixel 11$a$ are located between two adjacent light shielding patterns 300 (herein, the second light shielding pattern 300$b$ at the left side of the third pixel 11$c$ and the first light shielding pattern 300$a$ at the right side of the first pixel 11$a$). The first light shielding pattern 300$a$ at the left side of the second pixel 11$b$ and the second light shielding pattern 300$b$ at the right side of the second pixel 11$b$ are disposed adjacent to each other, and the first light shielding pattern 300$a$ at the left side of the second pixel 11$b$ and the second light shielding pattern 300$b$ at the right side of the second pixel 11$b$ are disposed at two opposite sides of the opening region 200 corresponding to the second pixel 11$b$. In other words, specific pixels 11 may be disposed with the light shielding patterns 300 according to actual needs, or specific pixels 11 may not be disposed with the light shielding pattern 300 therebetween according to actual needs. For other details of the electronic device 10$h$, references may be made to the related description of the electronic devices 10$f$ and 10$d$ and are not repeated herein.

Figure 11:
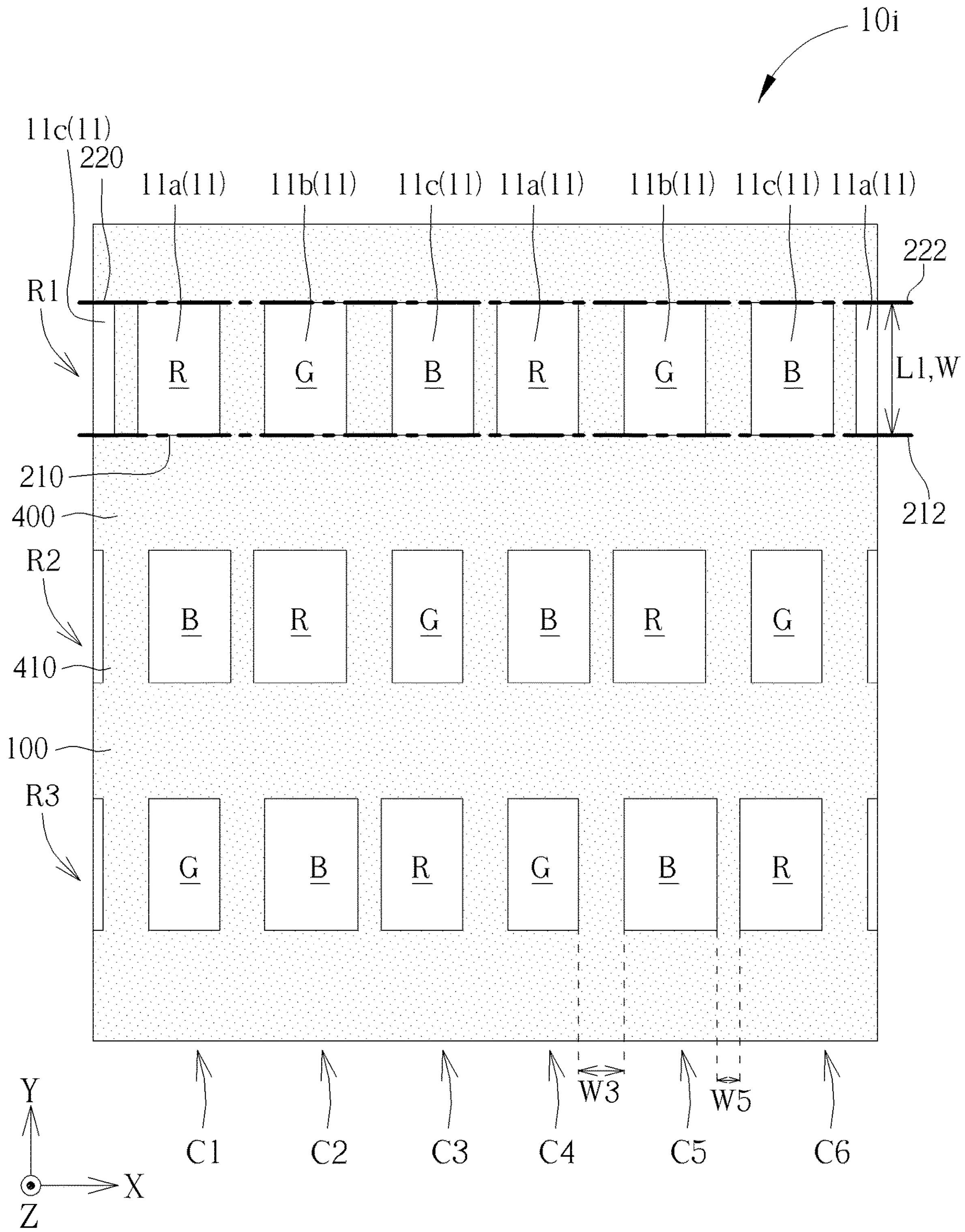
FIG. 11 is a schematic diagram showing a partial top view of an electronic device according to yet another embodiment of the present disclosure.

Please refer to FIG. 11, which is a schematic diagram showing a partial top view of an electronic device 10$i$ according to yet another embodiment of the present disclosure. The main differences between the electronic device 10$i$ and the electronic device 10$h$ shown in FIG. 10 are the arrangement of the first pixel 11$a$, the second pixel 11$b$ and the third pixel 11$c$, the electronic device 10$i$ having a larger pixel pitch PD (see FIG. 1) when the pixels per inch (PPI) is the same, and the configuration, such as the disposed positions, of the light shielding patterns 300. Similar to the electronic device 10$h$ shown in FIG. 10, specific pixels 11 of the electronic device 10$i$ are disposed with the light shielding patterns 300. Herein, the light shielding patterns 300 are exemplarily disposed at the left side and the right side of the second pixel 11$b$. For other details of the electronic device 10$i$, references may be made to the related description of the electronic device 10$h$ and are not repeated herein.

According to the present disclosure, with the light shielding pattern being disposed adjacent to the opening region, a ratio of the width of the first portion of the light shielding pattern in the second direction to the spaced distance between the first edge of the opening region and the second edge of the opening region in the second direction is from 0.3 to 0.7, or with two adjacent light shielding patterns including at least two opening regions therebetween, it is beneficial for the electronic device to achieve balance between the color shift and the opening rate. In the present disclosure, the light shielding pattern may be disposed on the data line, and the width of the light shielding pattern in the first direction may be greater than the width of the data line in the first direction, or the light shielding pattern may be integrally formed with the light shielding layer, which are beneficial to simplify the manufacturing process. For pixels located in the same row and arranged along the first direction, the positions of the light shielding patterns may be between different pixels by turns. For pixels located in the same column and arranged along the second direction, the positions of the light shielding patterns may be staggered left and right, and specific pixels may be disposed with the light shielding patterns according to actual needs or specific pixels may not be disposed with the light shielding patterns therebetween according to actual needs, which are beneficial to provide a better visual effects.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:

a substrate;

two data lines adjacently disposed on the substrate;

two scan lines adjacently disposed on the substrate, wherein the two data lines and the two scan lines define a pixel, and each of the two scan lines extends along a first direction;

an opening region disposed corresponding to the pixel, wherein the opening region has a first edge and a second edge, the first edge and the second edge are disposed opposite to each other and extend along the first direction, and there is a spaced distance between the first edge and the second edge in a second direction perpendicular to the first direction; and a light shielding pattern disposed adjacent to the opening region, wherein the light shielding pattern comprises a first portion located between a first extending line of the first edge and a second extending line of the second edge;

wherein a ratio of a width of the first portion in the second direction to the spaced distance is from 0.3 to 0.7.

2. The electronic device of claim 1, wherein a material of the light shielding pattern comprises a metal material, a black resin or a combination thereof.

3. The electronic device of claim 1, wherein the light shielding pattern is disposed on one of the two data lines, and a width of the light shielding pattern in the first direction is greater than a width of the one of the two data lines in the first direction.

4. The electronic device of claim 1, wherein the light shielding pattern further comprises a second portion, and the second portion is connected with the first portion and protrudes from the first extending line of the first edge along the second direction.

5. The electronic device of claim 1, wherein a number of the light shielding patterns is two, each of the light shielding patterns further comprises a second portion connected with the first portion, the second portion of one of the light shielding patterns protrudes from the first extending line of the first edge along the second direction, and the second portion of another one of the light shielding patterns protrudes from the second extending line of the second edge along the second direction.

6. The electronic device of claim 1, further comprising:

a light shielding layer disposed on the substrate, wherein the light shielding layer comprises a connecting portion located between the first extending line of the first edge and the second extending line of the second edge, the light shielding pattern is connected with the connecting portion, and a width of the light shielding pattern in the first direction is greater than a width of the connecting portion in the first direction.

7. The electronic device of claim 6, wherein a ratio of the width of the light shielding pattern in the first direction to the width of the connecting portion in the first direction is greater than 1 and less than or equal to 2.

8. The electronic device of claim 6, wherein the light shielding pattern is integrally formed with the light shielding layer.

9. An electronic device, comprising:

a substrate;

a plurality of data lines disposed on the substrate;

a plurality of scan lines disposed on the substrate, wherein the plurality of data lines and the plurality of scan lines define a plurality of pixels, and each of the plurality of scan lines extends along a first direction;

a plurality of opening regions disposed corresponding to the plurality of pixels respectively; and two light shielding patterns disposed adjacent to each other, wherein in the first direction, at least two opening regions of the plurality of opening regions are located between the two light shielding patterns.

10. The electronic device of claim 9, wherein the two light shielding patterns are respectively a first light shielding pattern and a second light shielding pattern, the electronic device further comprises a third light shielding pattern disposed adjacent to the first light shielding pattern, and the first light shielding pattern and the third light shielding pattern are disposed at two opposite sides of one of the plurality of opening regions.

11. The electronic device of claim 10, wherein the one of the plurality of opening regions having the first light shielding pattern and the third light shielding pattern disposed at the two opposite sides thereof is disposed corresponding to a green pixel of the plurality of pixels.

12. The electronic device of claim 9, wherein the at least two opening regions of the plurality of opening regions located between the two light shielding patterns are disposed corresponding to a red pixel and a blue pixel of the plurality of pixels.

13. The electronic device of claim 9, wherein a material of at least one of the two light shielding patterns comprises a metal material, a black resin or a combination thereof.

14. The electronic device of claim 9, wherein one of the two light shielding patterns is disposed on one of the plurality of data lines, and a width of the one of the two light shielding patterns in the first direction is greater than a width of the one of the plurality of data lines in the first direction.

15. The electronic device of claim 9, wherein each of the plurality of opening regions has a first edge and a second edge, the first edge and the second edge are disposed opposite to each other and extend along the first direction, there is a spaced distance between the first edge and the second edge in a second direction perpendicular to the first direction, and a width of one of the two light shielding patterns in the second direction is greater than the spaced distance.

16. The electronic device of claim 9, wherein each of the plurality of opening regions has a first edge and a second edge, the first edge and the second edge are disposed opposite to each other and extend along the first direction, and one of the two light shielding patterns has a portion protruding from a first extending line of the first edge along the second direction and another portion protruding from a second extending line of the second edge along the second direction.

17. The electronic device of claim 9, wherein:

each of the plurality of opening regions has a first edge and a second edge, and the first edge and the second edge are disposed opposite to each other and extend along the first direction; and the electronic device further comprises a light shielding layer disposed on the substrate, the light shielding layer comprises a plurality of connecting portions respectively located between a first extending line of the first edge and a second extending line of the second edge of one of the plurality of opening regions, and a width of each of the two light shielding patterns in the first direction is less than a width of each of the plurality of connecting portions in the first direction.

18. The electronic device of claim 9, wherein:

each of the plurality of opening regions has a first edge and a second edge, and the first edge and the second edge are disposed opposite to each other and extend along the first direction; and the electronic device further comprises a light shielding layer disposed on the substrate, the light shielding layer comprises a plurality of connecting portions respectively located between a first extending line of the first edge and a second extending line of the second edge of one of the plurality of opening regions, and a width of each of the two light shielding patterns in the first direction is greater than a width of each of the plurality of connecting portions in the first direction.

19. The electronic device of claim 18, wherein each of the two light shielding patterns is integrally formed with the light shielding layer.

20. The electronic device of claim 18, wherein a width of each of the two light shielding patterns in the second direction is equal to a width of each of the plurality of connecting portions in the second direction.

* * * * *